United States Patent [19]

Thompson

[11] Patent Number: 5,028,924
[45] Date of Patent: Jul. 2, 1991

[54] DIGITAL CORRECTION OF GAIN MISMATCH IN A SIGMA DELTA MODULATOR

[75] Inventor: Charles D. Thompson, Austin, Tex.

[73] Assignee: Motorola, Inc., Schaumburg, Ill.

[21] Appl. No.: 487,100

[22] Filed: Mar. 2, 1990

[51] Int. Cl.⁵ .............................................. H03M 1/06
[52] U.S. Cl. .................................. 341/118; 341/143; 375/26
[58] Field of Search ................ 341/118, 119, 120, 121, 341/131, 143, 155, 200, 161, 166, 122; 375/25, 26, 27, 28

[56] References Cited

U.S. PATENT DOCUMENTS

| | | | |
|---|---|---|---|
| 4,384,278 | 5/1983 | Benjamin | 341/143 |
| 4,704,600 | 11/1987 | Uchimura et al. | 341/122 |
| 4,843,390 | 6/1989 | van Bavel et al. | 341/118 X |
| 4,876,542 | 10/1989 | van Bavel et al. | 341/143 |

*Primary Examiner*—A. D. Pellinen
*Assistant Examiner*—Brian Young
*Attorney, Agent, or Firm*—Robert L. King

[57] ABSTRACT

An oversampling analog-to-digital converter is responsive to an analog input signal for providing a digital output signal representative of the magnitude of the analog input signal at an output bus. The analog input signal is quantized through a sigma delta modulator stages for providing first and second digital output signals which are recombined through at least first and second digital integrators and at least first and second digital differentiators of a low pass comb filter for providing the digital output signal. The first digital output signal controls the application of either a digital correction signal or digital zeroes to the least significant portion of a predetermined number of accumulator cells of the first digital integrator thereby substituting the digital correction signal for the digital output signal to weight the latter's contribution and compensate for the quantization error which increases the resolution of the digital output signal.

18 Claims, 6 Drawing Sheets

OUTPUT SIGNAL AFTER D/A

DIGITAL CORRECTION OF GAIN MISMATCH IN A SIGMA DELTA MODULATOR

CROSS REFERENCE TO RELATED PATENT APPLICATION

This application is related to copending U.S. patent application Ser. No. 07/487,337, "GENERATION OF A DIGITAL CORRECTION SIGNAL TO COMPENSATE FOR GAIN MISMATCHES IN A SIGMA DELTA MODULATOR", filed Mar. 2, 1990, by the same inventor and assigned to the same assignee, Motorola, Inc.

BACKGROUND OF THE INVENTION

This invention relates in general to analog-to-digital (A/D) converters, and more particularly, to an A/D converter including a multi-stage cascaded sigma delta ($\Sigma\Delta$) modulator wherein a digital correction technique is utilized for compensation of gain mismatches between the stages thereof.

Analog-to-digital converters are well enough known in the art and many techniques have been developed for achieving the conversion from analog to digital format. One A/D converter known of U.S. Pat. No. 4,704,600 issued to Uchimura et al includes a triple-cascade $\Sigma\Delta$ modulator wherein a continuous time analog input signal is sampled and quantized into three 1-bit digital output signals. As brought out in the '600 patent, the first and second stages also generate error signals of the difference between the actual magnitude of the input signals and the quantized output signals. In the triple-cascade approach, the error signal of the first stage is applied into the input of the second stage, and the error signal of the second stage is applied to the input of the third stage. These error signals are known as quantization error and can cause distortion in the digital output signal of the A/D converter. The quantized output signals of the three stages are recombined with the associated word growth and low-pass filtered to provide a multi-bit digital output signal representative of the magnitude of the analog input signal.

The aforementioned low-pass filtering is provided via a comb filter, the latter of which is thoroughly described in U.S. Pat. No. 4,876,542 issued to van Bavel et al and assigned to Motorola, Inc. The comb filter includes a number of serially coupled digital integrators and an equal number of serially coupled digital differentiators wherein the number determines the order of the filter. For a third order comb filter the output of the first stage of the $\Sigma\Delta$ modulator is coupled to the first integrator, while the outputs of the second and third stages are coupled to the second and third integrators, respectively. The digital integrators operate at the oversampling frequency $F_S$, while the digital differentiators operate at a predetermined lower frequency. The ratio of the oversampling frequency $F_S$ to the predetermined lower frequency is known as the decimation ratio. The multi-bit digital output signal is provided at the output of the last digital differentiator in the chain.

The theoretic performance of the A/D converter is determined by the oversampling frequency $F_S$ of the input signal which is typically 64 times the Nyquist sampling frequency. The Fourier transform of the $\Sigma\Delta$ quantization error signal provides a spectrum of energy in the frequency domain from zero to one-half the oversampling frequency $F_S$. The triple-cascade $\Sigma\Delta$ modulator tends to shape the distribution of the energy as an exponential-like function of frequency having the majority of the energy in the upper band of the spectrum allowing the lower frequency utilization band (in-band range) to be low-pass filtered thereby removing much of the quantization error and reducing the $\Sigma\Delta$ modulator quantum. This quantum is defined as the differential magnitude within which the input signal is resolved, and it is a function of the number of bits of resolution and the full-scale range of the input signal, thus, for one bit of resolution the quantum is full-scale range of the input signal. By reducing the quantization energy within the in-band range, the resolution of the multi-bit digital output signal may be increased since the discrepancy between the actual magnitude of the analog input signal at a particular sample point and the assigned quantized value is reduced, that is, the magnitude of the quantum becomes smaller.

A major contributor to the quantization error is the mismatches between the gain factors associated with the $\Sigma\Delta$ modulator stages. For ideal operation, the gain factors of the first, second and third stages must precisely match to achieve total cancellation of common error terms during the recombination of the quantized output signals thereof. However, the $\Sigma\Delta$ modulator stages typically include switched capacitor integrators for averaging the input signal, and it is beyond the capability of most if not all manufacturing processes to hold the tolerance on the capacitors within the boundaries necessary to achieve identical transfer functions for each stage. If the gains of the first, second and third stages do not exactly match, then total cancellation of common error terms generated in the $\Sigma\Delta$ modulator does not occur allowing leakage of the first order error signals and reducing the accuracy and resolution the multi-bit digital output signal. The error signal of the first stage is the most troublesome since it is comparing the full-scale range of the analog input signal to a 1-bit resolution output signal thus creating an undesirably large quantum. Hence, one problem with the aforedescribed prior art is its sensitivity to the individual gains of the triple-cascaded stages. Rather than attempt to hold difficult tolerances on the manufacturing process, it would be more desirable to simply compensate for gain mismatches with a correction factor during normal operation. Compensation techniques for gain matching are discussed in the prior art; however, the teachings center around the $\Sigma\Delta$ modulator and as such are typically analog in nature and limited in providing highly accurate compensation due to frequency dependent transfer function of the analog gain correction circuitry.

Hence, what is needed is an improved A/D converter comprising a multistage cascaded $\Sigma\Delta$ modulator, the output of which is coupled through a comb filter for providing the digital output signal wherein a digital correction technique is utilized within the comb filter to compensate for gain mismatches between the $\Sigma\Delta$ modulator stages thereby increasing the resolution of the digital output signal. The digital correction factor may be determined through a calibration cycle during test, or even as part of a power-up initialization sequence.

SUMMARY OF THE INVENTION

Accordingly, it is an objective of the present invention to provide an improved A/D converter.

A further objective of the present invention is to provide an improved A/D converter comprising a multi-stage cascaded $\Sigma\Delta$ modulator and a low-pass comb filter including an equal number of digital integrators and digital differentiators for providing a multi-bit digital output signal representative of the magnitude of the analog input signal.

Another objective of the present invention is to provide an improved A/D converter wherein a digital correction signal is applied to at least one digital integrator to compensate for the gain mismatches in the $\Sigma\Delta$ modulation stages thereby reducing the in-band quantization error and increasing the resolution of the multibit digital output signal.

Yet another objective of the present invention is to provide an improved A/D converter including a compensation generator for developing the digital correction signal which will compensate for gain mismatches in the $\Sigma\Delta$ modulation stages.

Still another objective of the present invention is to provide an improved A/D converter including a counter to store the digital correction signal.

In accordance with the above and other objectives there is provided an A/D converter responsive to an analog input signal and having an output bus for providing a digital output signal representative of the magnitude of the analog input signal comprising a sigma delta modulator for quantizing the analog input signal into first and second digital output signals wherein the first and second digital output signals include quantization error resulting from component mismatches between the stages of the sigma delta modulator. The first and second digital output signals are applied to a comb filter which includes first and second digital integrators each having a predetermined number of accumulator cells wherein a first digital correction signal is applied to a least significant portion of the predetermined number of accumulator cells of the first digital integrator for the first logic state of the first digital output signal while a second digital correction signal is applied to the least significant portion of the predetermined number of accumulator cells for the second logic state of the first digital output signal for substitution of the first digital correction signal as a weighted value of the first digital output signal which compensates for the component mismatches thereby reducing the quantization error and increasing the resolution of the digital output signal. The comb filter also includes first and second digital differentiators coupled between the first and second digital integrators and the output bus.

DETAILED DESCRIPTION OF THE PREFERRED EMBODIMENT

Figure 1:
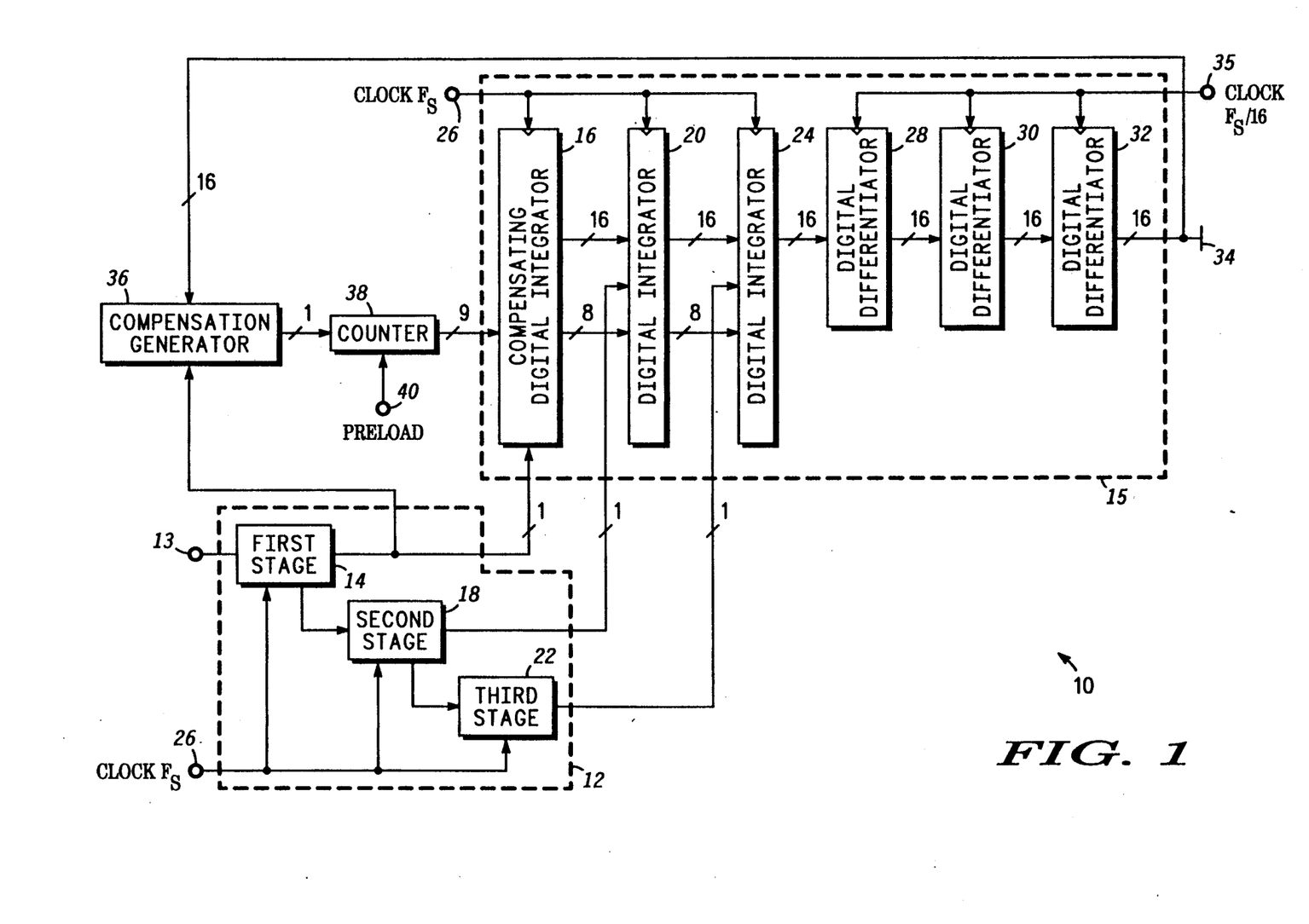
FIG. 1 is a simplified block diagram illustrating the preferred embodiment of the present invention.

Referring to FIG. 1, A/D converter 10 as shown is suitable for manufacturing in integrated circuit (IC) form using conventional integrated circuit processes. A/D converter 10 comprises triple-cascade $\Sigma\Delta$ modulator 12 having an input coupled for receiving an analog input signal at input 13 and having a plurality of outputs coupled to comb filter 15. Input 13 is coupled to the first input of $\Sigma\Delta$ modulator stage 14, the first output of which is coupled to the first input of digital integrator 16, while the second output of stage 14 is coupled to the first input of $\Sigma\Delta$ modulator stage 18. The first and second outputs of stage 18 are coupled to digital integrator 20 and to the first input of $\Sigma\Delta$ modulator stage 22, respectively, while the output of the latter is coupled to digital integrator 24. An oversampling clock signal $F_S$ typically operating at 64 times the Nyquist sampling frequency of the analog input signal is applied through input 26 to stages 14, 18, and 22, and to digital integrators 16, 20 and 24.

Digital integrators 16, 20 and 24 each typically include twenty-four accumulating cells configured for performing the digital integration, while digital differentiators 28, 30 and 32 each include sixteen accumulating cells configured for performing the digital differentiation. The output of compensating digital integrator 16 provides a 24-bit digital signal (shown as sixteen upper lines and eight lower lines) which is applied at the input of digital integrator 20, the output of which also supplies a 24-bit digital signal to digital integrator 24. The upper sixteen most significant bits (MSB) of the 24-bit digital output signal of digital integrator 24 forms a 16-bit digital output signal thereof which is differentiated three times through digital differentiators 28, 30, and 32 and applied at output bus 34 for providing a 16-bit digital output signal representative of the magnitude of the analog input signal. Digital differentiators 28, 30, and 32 are clocked at a frequency of oversampling clock signal $F_S$ divided by 16 which is applied at input 35. Output bus 34 and the first output of stage 14 are also coupled to the first and second inputs of compensation generator 36, respectively, while the output of the latter is coupled to the up/down control input of counter 38. The current state of counter 38 is applied to digital integrator 16 as the 9-bit digital correction signal. Counter 38 is also responsive to a preload signal applied at input 40 for initializing it to a predetermined value. It is understood that higher order filters may be substituted for comb filter 15, such as a fourth order comb filter, for providing improved filtering by further attenuating the in-band error signal. Furthermore, additional filtering stages (not shown) may be cascaded to output 34 again improving the filter operation while the output of the additional filtering stages may be applied to the first input of compensation generator 36.

Figure 2:
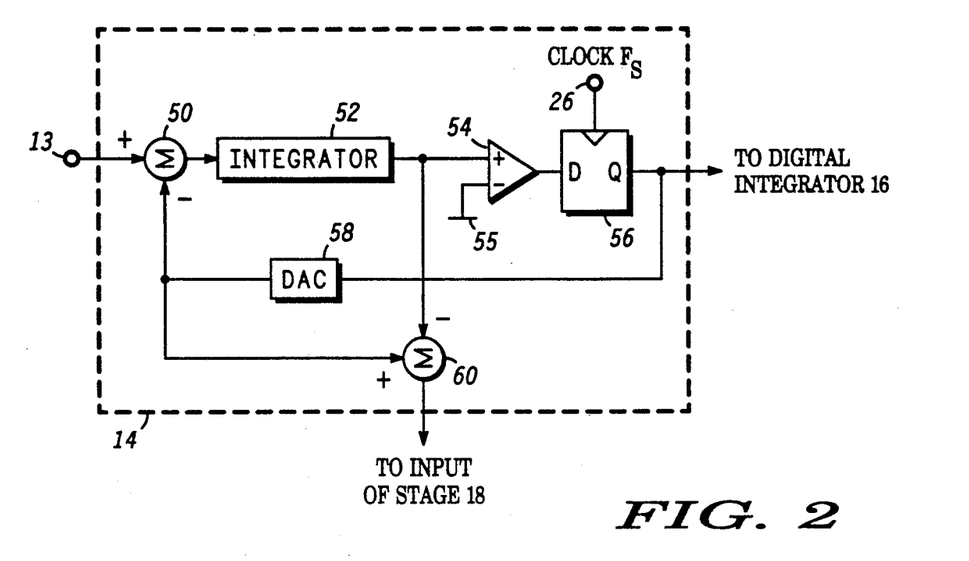
FIG. 2 is a simplified schematic and block diagram of one stage of the $\Sigma\Delta$ modulator.

Turning to FIG. 2, additional detail of stage 14 is shown wherein the analog input signal applied at input 13 is summed through summing junction 50 and applied to the input of integrator 52. The output of integrator 52 is coupled to the first input of comparator 54, while the second input of the same is referenced to a reference potential applied at terminal 55, such as one-half the positive supply potential. The output of comparator 54 is coupled to the input of D-type flipflop 56, and the output of comparator 54 provides the 1-bit quantized output signal that is applied to the first input of digital integrator 16 and through digital-to-analog converter (DAC) 58 to the inverting input of summing junction 50. In addition, the output of integrator 52 and the inverting input of summing junction 50 are coupled to the non-inverting and inverting inputs of summing junction 60, respectively, the output of which provides an error signal of the difference between the actual analog input signal and the quantized output signal thereof. This error signal is applied to the first input of stage 18. Likewise, stages 18 and 22 comprise the same configuration as stage 14, wherein the 1-bit quantized output signal of stage 18 is applied to digital integrator 20 while the error signal of stage 18 provides the input signal for stage 22, and the 1-bit quantized output signal of stage 22 is applied to digital integrator 24. Notably, stage 22 does not require like summing junction 60 since only the 1-bit quantized output signal is utilized. Recalling that the frequency of oversampling clock signal $F_S$ is much, much greater than the maximum frequency component of the input signal, if the averaged value of the analog input signal minus the feedback signal via DAC 58 is greater than the reference potential, then the output signal of comparator 54 is logic one; otherwise, if the averaged value of the analog input signal minus the feedback signal via DAC 58 is less than the reference potential, the output signal of comparator 54 is logic zero.

The operation of triple-stage $\Sigma\Delta$ modulator 12 is thoroughly described in U.S. Pat. No. 4,704,600, "OVERSAMPLING CONVERTER", issued to Uchimura et al and is hereby incorporated by reference. Briefly, stages 14, 18 and 22 are first order modulators and as such are unconditionally stable. The output signal of the stage 14, $V_{14}$, can be shown to be:

$$V_{14}=K_{14}(V_{13}+e_{14}(1-z^{-1})) \quad (1)$$

where:
$V_{13}$ is the input signal applied at input 13
$K_{14}$ is the gain of stage 14
$e_{14}$ is the error signal provided at the second output of stage 14
z is the well known z-transform variable Furthermore, the output signals of respective stages 18 and 22, $V_{18}$ and $V_{22}$, can be shown to be:

$$V_{18}=K_{18}(e_{14}+e_{18}(1-z^{-1})) \quad (2)$$

and $$V_{22}=K_{22}(e_{18}+e_{22}(1-z^{-1})) \quad (3)$$

where:
$K_{18}$ is the gain of stage 18
$e_{18}$ is the error signal provided at the second output of stage 18
$K_{22}$ is the gain of stage 22
$e_{22}$ is the error signal provided at the second output of stage 22

The output signals $V_{14}$, $V_{18}$ and $V_{22}$ defined in equation (1), (2) and (3) may be recombined by changing the sign and taking the first derivative of equation (2) and taking the second derivative of equation (3) and summing the result. In the present embodiment, this is accomplished by applying output signal $V_{14}$ to digital integrator 16, output signal $V_{18}$ to digital integrator 20 and output signal $V_{22}$ to digital integrator 24. Hence, output signal $V_{14}$ is integrated three times before being applied to digital differentiator 28, while output signal $V_{18}$ is integrated twice and output signal $V_{22}$ is integrated only once. Since integration is the reverse operation of differentiation, integrating output signal $V_{18}$ one less time is the same as differentiating once, and integrating output signal $V_{22}$ two less times is the same as differentiating twice.

In the z-domain, the operation of differentiation is provided by the operator $(1-z^{-1})$. Thus, by changing the sign and taking the first derivative of equation (2) and taking the second derivative of equation (3), the sum thereof yields:

$$V_{SUM}=K_{14}(V_{12}+e_{14}(1-z^{-1}))-K_{18}(e_{14}+e_{18}(1-z^{-1}))(1-z^{-1})+K_{22}(e_{18}+e_{22}(1-z^{-1}))(1-z^{-1})^2 \quad (4)$$

For ideal conditions when $K=K_{14}=K_{18}=K_{22}$, equation (4) reduces to:

$$V_{SUM}=K(V_{12}+e_{22}(1-z^{-1})^3) \quad (5)$$

Equation (5) yields the ideal result wherein $V_{SUM}$ is equal to the input signal $V_{13}$ plus the third order derivative of the error signal $e_{22}$ all multiplied by gain factor K. The 16-bit digital output signal at output bus 34 is then equal to $V_{SUM}$ multiplied by the transfer function of comb filter 15. Notice that the error signals $e_{14}$ and $e_{18}$ of stages 14 and 18 are mathematically eliminated in equation (5). Notably, $V_{SUM}$ unto itself does not appear at any particular output, but rather is an intuitive representation of the operation.

Figure 3:
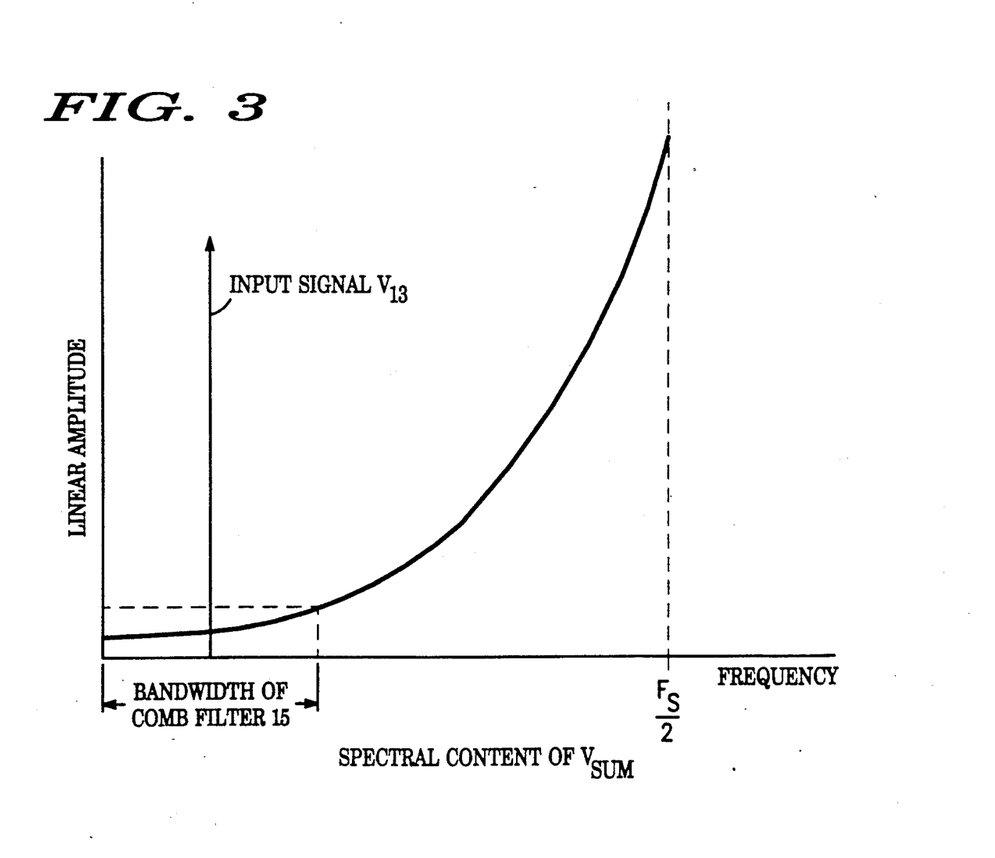
FIG. 3 is a plot of the frequency spectrum of the recombination of the digital output signals of the $\Sigma\Delta$ modulator.

The spectral frequency content of output signal $V_{SUM}$ is shown in FIG. 3 wherein the vast majority of the spectral energy of error signal $e_{22}$ is distributed in the upper band of the spectrum because of the third order transformation. Low-pass comb filter 15 formed of digital integrators 16, 20 and 24 and digital differentiators 28, 30 and 32 blocks the undesirable high frequency energy of the error signal leaving the in-band range including the analog input signal and a much reduced contribution from error signal $e_{22}$ thereby increasing the output resolution. The error signal is down approximately 96 dB from the analog input signal, the latter of which is well within the bandwidth of comb filter 15. Notably, a SNR of 96 dB is needed for 16 bits of output resolution from the well known equation: $SNR \approx 6.0 \times N$, where SNR is the signal to noise ratio and N is the number of bits of resolution.

The previous discussion considered an ideal operation wherein the gain of stages 14, 18 and 22 are matched. However, as noted in the background of the invention, it is very difficult to provide such gain matching due in part to manufacturing tolerances. Without the precise gain matching, equation (4) does not exactly reduce to equation (5), instead the latter includes first order noise leakage from error signals $e_{14}$ and $e_{18}$ causing distortion and loss of output resolution. Error signal $e_{14}$ is the major concern since stage 14 is comparing the full-scale range of input signal $V_{13}$ to 1-bit output signal $V_{14}$ thus creating an undesirably large quantum. The present invention does not attempt to gain match stages 14, 18 and 22 which would be a difficult task indeed, but rather simply compensates for gain mismatches therebetween through control of one or more of digital integrators 16, 20 and 24.

Figure 4:
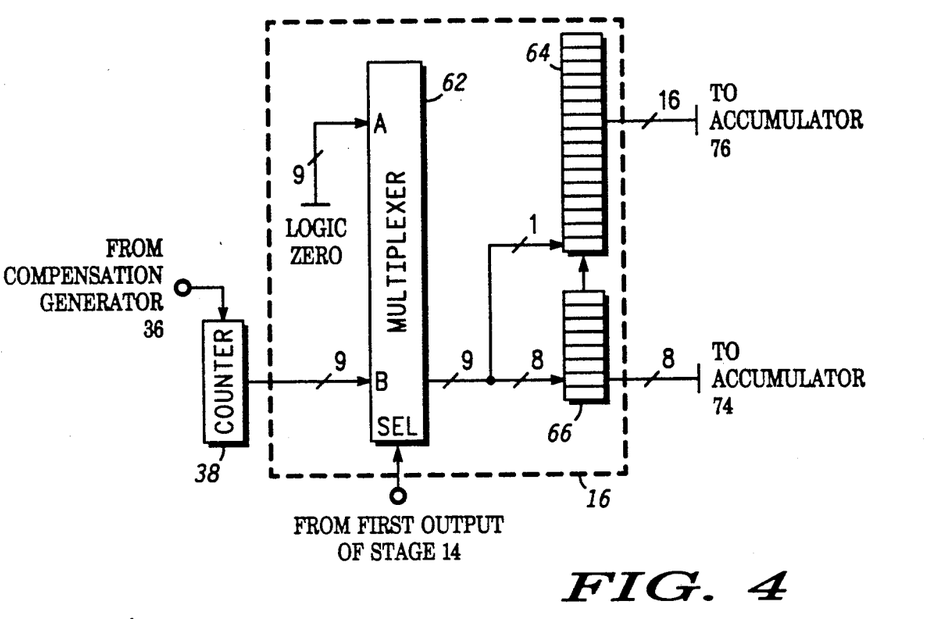
FIG. 4 is a simplified block diagram illustrating a compensating digital integrator.

Although portions of comb filter 15 are thoroughly described in U.S. Pat. No. 4,876,542, "MULTIPLE OUTPUT OVERSAMPLING A/D CONVERTER WITH EACH OUTPUT CONTAINING DATA AND NOISE", issued to van Bavel et al and assigned to Motorola, Inc, and hereby incorporated by reference, digital integrators 16, 20 and 24 also include certain novel features. Digital integrator 16 is shown in greater detail in FIG. 4 comprising multiplexer 62 having a first input at which nine digital zeros are applied, and a second input coupled to the output of counter 38. The 1-bit digital output signal of stage 14 is applied to the control input of multiplexer 62 whereby either the nine digital zeros or the 9-bit digital correction signal of counter 38 is routed therethrough. The single MSB of the 9-bit digital output signal of multiplexer 62 is applied to the least significant bit (LSB) cell of accumulator 64, while the remaining eight LSB are applied to the eight cells of accumulator 66, respectively. Hence, digital integrator 16 is shown as a compensating-type responsive to either the nine digital zeroes or the 9-bit digital correction signal under control of the 1-bit digital output signal of stage 14 whereby the 9-bit digital correction signal is substituted therefor to provide compensation of the error signal leakage from $\Sigma\Delta$ modulator 12; further discussion is forthcoming.

Figure 5:
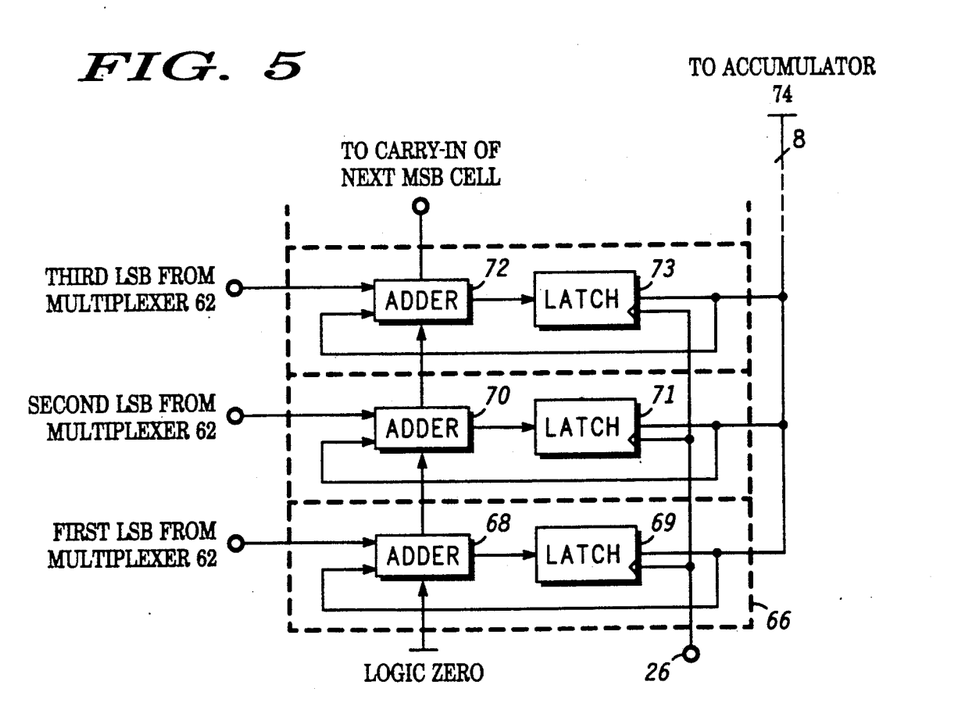
FIG. 5 is a simplified block diagram showing the accumulating adders of the digital integrator.

Referring to FIG. 5, the three LSB adders of accumulator 66 are shown in greater detail including adders 68, 70, and 72, respectively, to illustrate the intraconnection thereof. The first add-in of adder 68 is coupled to the first LSB output of multiplexer 62, while the output of adder 68 is coupled through latch 69 to the first LSB input of accumulator 74 and to the second add-in of adder 68. Likewise, the first add-in of adder 70 is coupled to the second LSB output of multiplexer 62, and the output is coupled through latch 71 to the second LSB input of accumulator 74 and to the second add-in of adder 70. The first add-in of adder 72 is coupled to the third LSB output of multiplexer 62, while the output is coupled through latch 73 to the third LSB input of accumulator 74 and to the second add-in of adder 72. The oversampling clock signal $F_S$ is commonly applied through input 26 to the clock inputs of latches 69, 71 and 73. Adders 68, 70, and 72 also include carry-in and carry-out, wherein the carry-in of adder 68 is coupled to a terminal at which a logic zero is applied, and the carry-out of adder 68 is coupled to the carry-in of adder 70, while the carry-out of adder 70 is coupled to the carry-in of adder 72. The remaining adders of accumulators 64 and 66 are connected in a like manner. Notably, the carry-out of the MSB adder of accumulator 66 is coupled to the carry-in of the LSB adder of accumulator 64, and the carry-out of MSB adder of accumulator 64 is open-circuited. In general, accumulators 64 and 66 perform digital integration through adders 68, 70, 72, etc., by summing the current state of the input signal with the previous state using modulo arithmetic and carrying forward the overflow bit.

Figure 6:
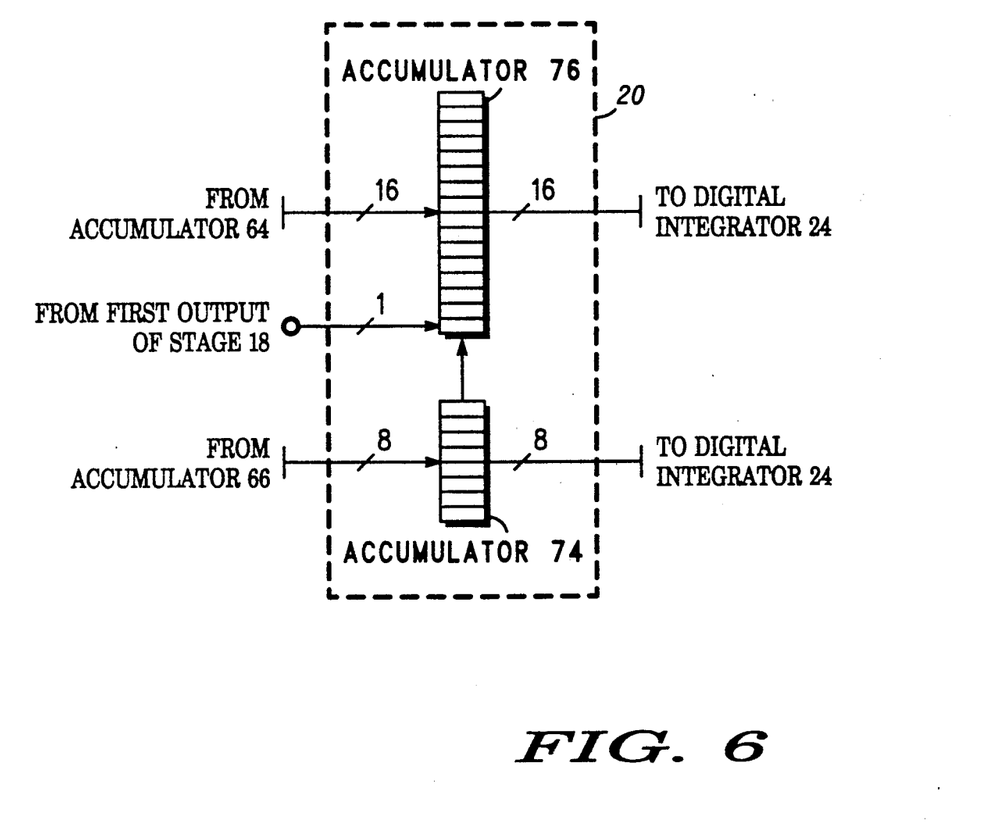
FIG. 6 is a simplified block diagram illustrating a non-compensating digital integrator.

Turning to FIG. 6, there is shown greater detail of digital integrator 20 configured as a non-compensating type digital integrator. Accumulators 74 and 76 comprise typically eight and sixteen cells, respectively, for digitally integrating the 24-bit digital output signal of digital integrator 16. The 8-bit digital output signal of accumulator 66 is applied at the eight inputs of accumulator 74, the output of which provides an 8-bit digital output signal to digital integrator 24. The 16-bit digital output signal of accumulator 64 is applied at the respective inputs of accumulator 76, the output of which provides a 16-bit digital output signal to digital integrator 24. In addition, the first output of stage 18 is coupled to the LSB cell of accumulator 76.

Figure 7:
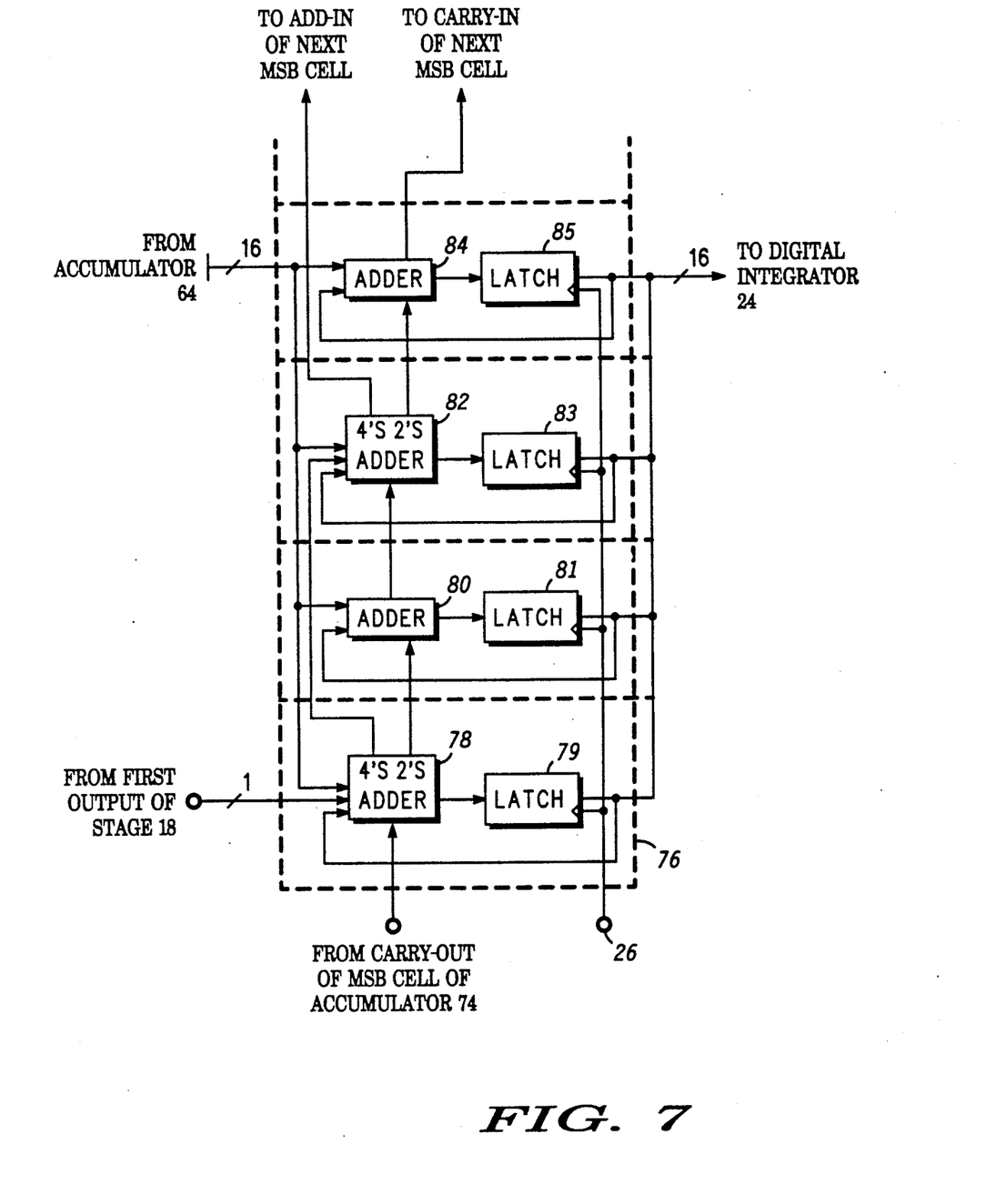
FIG. 7 is a simplified block diagram showing the accumulating adders of the non-compensating digital integrator.

Accumulator 74 includes the same components as demonstrated for accumulators 64 and 66 in FIG. 5; however, accumulator 76 requires a different intraconnection for proper combination of the 1-bit digital output signal of stage 18 and the 16-bit digital output signal of accumulator 64. More specifically, accumulator 76 comprises adders 78, 80, 82 and 84 such as shown in FIG. 7 wherein adders 78 and 82 and alternate MSB adders of accumulator 76 thereafter are four-bit adders, and as such each provides a single 1-bit digital output signal and two 1-bit carry-out signals; one for the 2's carry and one for the 4's carry as is understood. Otherwise, adders 80 and 84 and alternate MSB adders thereafter are three-bit adders providing a single 1-bit digital output signal and one carry-out signal. The carry-out of the MSB adder of accumulator 74 is coupled to the carry-in of adder 78. The first LSB of the 16-bit digital output signal of accumulator 64 is applied to the first add-in of adder 78, while the 1-bit digital output signal of stage 18 is applied to the second add-in and the 1-bit digital output signal of adder 78 is applied through latch 79 to the third add-in. The second LSB of the 16-bit digital output signal of accumulator 64 is applied to the first add-in of adder 80, while the 1-bit digital output signal of the same is applied through latch 81 to the second add-in and the 2's carry-out of adder 78 is coupled to the carry-in of adder 80. Likewise, the third LSB of the 16-bit digital output signal of accumulator 64 is applied to the first add-in of adder 82, while the 4's carry-out of adder 78 is coupled to the second add-in and the 1-bit digital output signal of adder 82 is applied through latch 83 to the third add-in. Furthermore, the carry-out of adder 80 is coupled to the carry-in of adder 82. The fourth LSB of the 16-bit digital output signal of accumulator 64 is applied to the first add-in of adder 84, while the 1-bit digital output signal of the adder 84 is applied through latch 85 to the second add-in and the 2's carry-out of adder 82 is coupled to the carry-in of adder 84. The combination of adders 82 and 84 is repeated for the remaining cells of accumulator 76. The adders of accumulator 76 provide the 16-bit digital output signal that is applied to digital integrator 24. The clock inputs of latches 79, 81, 83 and 85 are responsive to oversampling clock signal $F_S$ applied at input 26. Furthermore, digital integrator 24 being non-compensating type in the present embodiment includes the same components and intraconnection as described for digital integrator 20 in FIG. 6 and 7.

Although not illustrated in detail, digital differentiators 28, 30 and 32 each include sixteen accumulating cells each comprising an adder and a delay circuit configured for digital differentiation which is understood. The sixteen accumulating cells of digital differentiator 28 are respectively coupled to the outputs of the sixteen MSB accumulating cells of digital integrator 24, while the outputs of the accumulating cells of digital differentiator 32 are coupled to output bus 34; LSB to LSB and MSB to MSB. The number of adder cells in digital integrators 16, 20 and 24 as well as digital differentiators 28, 30 and 32 is typically determined by the decimation ratio of comb filter 15, that is, the greater the decimation ratio, the greater the width of the accumulators thereof.

The previous text describes the components in use during normal operation wherein the 9-bit digital correction signal is applied to digital integrator 16 under control of the 1-bit digital output signal of stage 14 which, as will be shown, compensates for the in-band noise in the 16-bit digital output signal provided at output bus 34. Before launching into a detailed discussion of the normal operating mode, it is believed that an explanation of the origin of the 9-bit digital correction signal will be helpful in the overall understanding.

Figure 8:
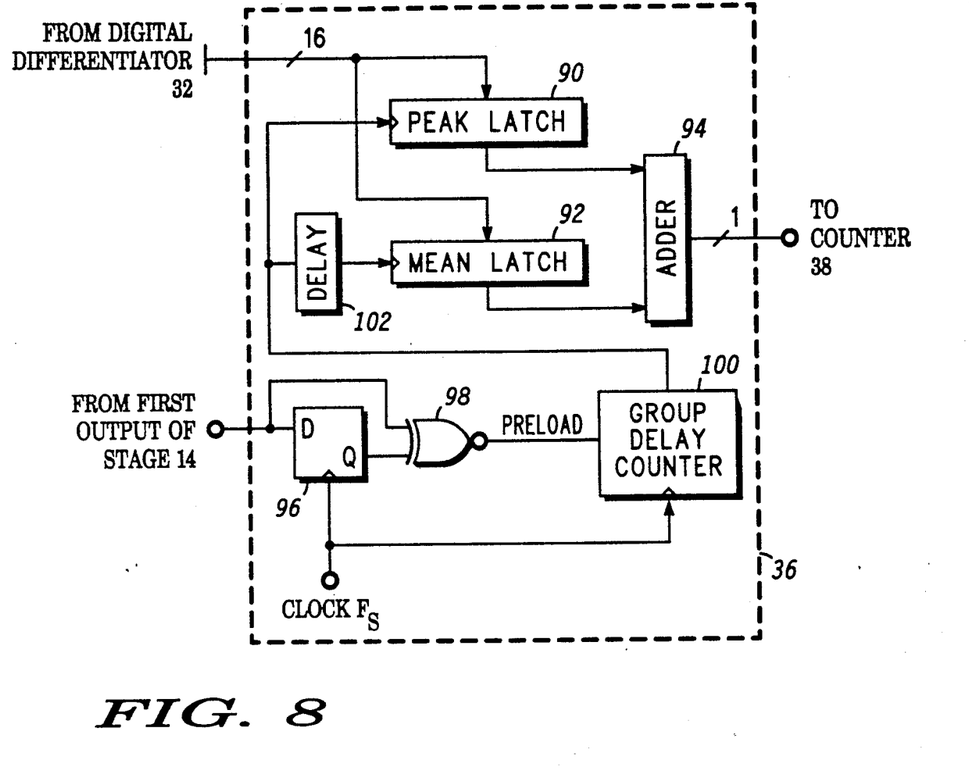
FIG. 8 is a simplified schematic and block diagram illustrating the gain compensation generator.

Referring to FIG. 8, compensation generator 36 is shown in greater detail comprising peak latch 90 and mean latch 92 each having an input coupled for receiving the 16-bit digital output signal provided at output bus 34. The outputs of peak latch 90 and mean latch 92 are coupled to the first and second inputs of adder 94, the 1-bit output of which is coupled to the up/down control input of counter 38. Compensation generator 36 also includes D-type flipflop 96 responsive to oversampling clock signal $F_S$ and having an input coupled to the first output of stage 14 and to the first input of exclusive-NOR gate 98, and an output coupled to the second input of exclusive-NOR gate 98. The output of exclusive-NOR gate 98 is coupled to the pre-load control input of counter 100, the latter of which also receives oversampling clock signal $F_S$. The output of counter 100 is coupled to the clock input of peak latch 90 and through delay circuit 102 to the clock input of mean latch 92. In general, compensation generator 36 manipulates the up/down control input of counter 38 whereby a 9-bit number is stored therein for compensation of the gain mismatches between stages 14 and 18 via digital integrator 16.

Figure 9:
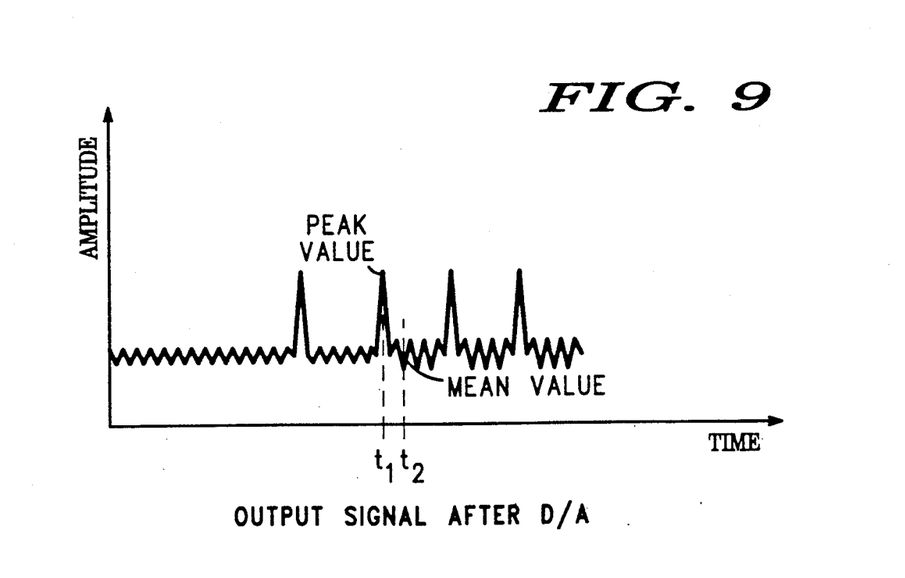
FIG. 9 is a waveform plot useful in the explanation of the determination of the digital correction signal.

Consider the initialization of A/D converter 10 at power-up, wherein a preload pulse is applied at input 40 to pre-load counter 38 with say approximately one quarter of the full-scale 9-bit value, "001000000". A close observation of the 1-bit quantized output signal of stage 14 reveals an important correlation between input signal $V_{13}$ and the temporal digital output stream thereof. More specifically, should a noiseless ground potential be applied at input 13, the 1-bit digital output signal at the output of D-type flipflop 56 alternates evenly between logic one and logic zero at the frequency of oversampling clock signal $F_S$, i.e., "01010101. . .". Now assume that input signal $V_{13}$ is made a low level DC (direct current) value sufficient to activate $\Sigma\Delta$ modulator 12 and generate first and second order noise in the three 1-bit digital output signals thereof, such noise being induced through the gain mismatches between stages 14,18 and 22 as illustrated in FIG. 9. The waveform of FIG. 9 is representative of the 16-bit digital output signal provided at output bus 34 following a digital-to-analog conversion (not shown), that is, it is a reconstruction of the low level DC input signal $V_{13}$ from the 16-bit digital output signal. The waveform is typically for the condition of first order noise leakthrough due to mismatches between stages 14 and 18 for the given low level DC input signal.

It is desirable to eliminate the noise in the 16-bit digital output signal whereby more of the spectral energy of the error signal is shifted out of the in-band frequency range into the upper frequency range thereby reducing the $\Sigma\Delta$ modulator quantum and increasing the resolution of the 16-bit digital output signal. By observation, the onset of a spike such as at time $t_1$ of FIG. 9 is correlated to the occurrence of two or more consecutive logic one or logic zero output signals of D-type flipflop 56. With this information, it is now conceivable to measure the peak value of the spike at time $t_1$, measure mean value of the 16-bit digital output signal at time $t_2$ and adjust counter 38 to compensate therefore so as to reduce the magnitude of the spikes until the desired noise suppression of the 16-bit digital output signal is achieved. Toward this end, the output signal of D-type flipflop 56 is applied to the data input of D-type flipflop 96 that is the first input of exclusive-NOR gate 98, while the output of D-type flipflop 96 is coupled to the second input of exclusive-NOR gate 98. Such a connection provides a delay and allows exclusive-NOR gate 98 to monitor two consecutive logic signals at the output of D-type flipflop 96. Thus, the output signal of exclusive-NOR gate 98 changes state at the occurrence of two consecutive logic zeros or logic ones applied at the inputs thereof at which time counter 100 is loaded with a count equal to the group delay (propagation delay) of comb filter 15 which may be calculated from the order of the filter and the decimation ratio as follows:

$$D_G = \frac{N \times (R - 1)}{2} \qquad (6)$$

where:

$D_G$ is the group delay in $F_S$ clock cycles

N is the order of comb filter 15 (3 in the present embodiment)

R is decimation ratio between oversampling clock signal $F_S$ and clock signal $F_S/16$ (16 in the present embodiment)

The time interval between the occurrence of two consecutive logic states of the same level at the output of D-type flipflop 56 and the corresponding spike in the 16-bit digital output signal is $3 \times (16-1)/2 = 22.5$, or rounded to 23 $F_S$ clock cycles, that is the time for the quantized output signals of $\Sigma\Delta$ modulator 12 to propagate through comb filter 15. Counter 100 counts down at frequency of oversampling clock signal $F_S$ and toggles the clock input of peak latch 90 at zero count thereby latching the 16-bit digital output signal into peak latch 90. Sometime later, time $t_2$, the change of state of the output signal of counter 100 propagates through delay circuit 102 and toggles the clock input of mean latch 92 thereby latching the 16-bit digital output signal after the spike has subsided. The interval of delay circuit 102 (time $t_1$ to time $t_2$) is typically four cycles of oversampling clock signal $F_S/16$ applied at input 35.

The sample of the 16-bit digital output signal at time $t_1$ stored in peak latch 90 is added with two's complement of the sample of the 16-bit digital output signal at time $t_2$ stored in mean latch 92 thereby subtracting the latter from the former. The sign bit of the result then controls the up/down control of counter 38, that is, if the result if positive, counter 38 increases in count value, otherwise, if the result is negative, counter 38 decreases in count value. A larger binary value in counter 38 tends to increase the magnitude of the spikes with respect to the mean value, while a smaller binary value tends to decrease the magnitude of the spikes. The aforedescribed calibration process continues until the value stored in peak latch 90 is approximately equal to the value stored in mean latch 92 whereby the noise spikes in the 16-bit digital output signal is substantially removed. The end of the calibration cycle may be determined by numerous methods, for example, the convergence period may be ascertained as say 1000 $F_S$ clock cycles after which convergence is guaranteed and the dual-sampling/subtraction process being repeated for the given number of cycles. Another method may involve identifying the signatures of the values in peak latch 90 and mean latch 92 at convergence and triggering the completion of the calibration when the signatures are detected, or merely comparing the multi-bit result of adder 94 with a predetermined small threshold and declaring a convergence when the former is less the threshold for predetermined number of cycles. Nonetheless for any given method, the goal is to manipulate the value stored in counter 38 until the noise spikes are reduced in the 16-bit digital output signal to a sufficiently low level.

In the prior art, the 1-bit digital output signal of each $\Sigma\Delta$ modulator stage is applied to one add-in of the LSB accumulating adder of the associated digital integrator, that is, the full weight of the 1-bit digital output signal directly contributes to the ongoing digital integration, whereas, the present invention uses the 1-bit digital output signal of stage 14 as a control bit to switch in a digital correction signal which is applied to an extension of the accumulating cells (accumulator 66) creating a numeric substitution (either greater than or less than one) of the 1-bit digital output signal of stage 14 thereby weighting its contribution in a manner to compensate for the error signal passed from the $\Sigma\Delta$ modulator stages because of the gain mismatches thereof.

Returning to FIG. 1 with the 9-bit digital correction signal stored in counter 38, A/D converter 10 may commence normal operation with, for example, a sinusoidal input signal applied at input 13. The averaged sinusoidal input signal is compared with the reference potential applied at the first input of comparator 54. The 1-bit digital output signal of stage 14 is applied to the control input of multiplexer 62 of FIG. 4 thereby selecting either the 9-bit digital correction signal for a logic one at the control input or the nine logic zeroes for a logic zero at the control input. The MSB of the output signal of multiplexer 62 is applied to the add-in of the first LSB adder of accumulator 64, while the remaining eight LSB are applied to the respective add-in of the aforedescribed adders of accumulator 66. The add-in of the sixteen MSB adders of accumulator 64 are typically coupled to a terminal operating at logic zero potential. Alternately, the add-in of the sixteen MSB adders of accumulator 64 may be coupled for receiving another digital signal such as the two's complement of the 9-bit digital correction signal. Since the carry-out of the MSB adder of accumulator 66 is coupled to the carry-in of the LSB of accumulator 64, accumulator 66 effectively behaves as a fractional portion of the overall 24-bit word of digital integrator 16, wherein the interconnection of accumulators 64 and 66 is the radix point. Hence, the additional word length of digital integrator 16 provided by accumulator 66 supports a value less than the LSB of accumulator 64, wherein the 9-bit digital correction signal accumulates up and rolls over into the carry-in of the LSB of accumulator 64 thereby effectively adjusting the contribution of the 1-bit digital output signal of stage 14 to the ongoing digital integration and weighting it by the 9-bit digital correction signal.

For example, it may have been determined from the aforedescribed start-up calibration process, that the 1-bit digital output signal of stage 14 must be weighted by 90% of its actual value to compensate for gain mismatches between stages 14, 18 and 22. When a logic one appears at the output of stage 14, multiplexer 62 switches in a 9-bit binary value of "011100110" (0.90 decimal weight). Conversely, when a logic zero appears at the output of stage 14, multiplexer 62 switches in the nine logic zeroes. Hence, the digital correction signal having been previously calibrated to eliminate the noise in the digital output signal at output bus 34 is substituted for the 1-bit digital output signal of stage 14 thereby providing a weighted value thereof which compensates for the error signal leakage of stages 14 and 18. The binary value integrated through accumulator 66 carries over into the accumulator 64 and the temporal data stream of 1-bit output signal of stage 14 continues to indirectly update digital integrator 16 via the appropriate weighting of the 9-bit digital correction signal. Notably, if the gains of stages 14, 18 and 22 should happen to have been perfectly matched during manufacturing, then counter 38 would simply contain a weight factor of 100% or equivalently, "100000000", as would have been established during the calibration sequence.

It is understood that digital integrators 18 and 22, or combination thereof may also be configured as compensation type digital integrators in addition to or in lieu of digital integrator 16. Typically, a separate counter (i.e. counter 38) is provided for each digital integrator for storing the digital correction signal associated therewith.

Hence, what has been described is a novel A/D converter including multistage cascaded $\Sigma\Delta$ modulator coupled through a low-pass comb filter for providing a digital output signal representative of the magnitude of the analog input signal wherein a digital correction signal is used to compensate for gain mismatches in the $\Sigma\Delta$ modulation stages by weighting the digital output signal thereof applied at least one of the digital integrators of the comb filter thereby reducing the error signal leakage and increasing the resolution of the multi-bit digital output signal. Whereas the prior art uses the full weight of the 1-bit digital output signal as direct nonadjustable contribution to the ongoing digital integration, the present invention uses the 1-bit digital output signal of $\Sigma\Delta$ modulator stage as a control bit to substitute the digital correction signal for the 1-bit digital output signal thereby weighting the latter's contribution to compensate for the error signal leakage.

I claim:

1. An oversampling analog-to-digital converter responsive to an analog input signal for providing a digital output signal representative of the magnitude of the analog input signal at an output bus, comprising:
   first means for quantizing the analog input signal into at least first and second digital output signals wherein said at least first and second digital output signals include quantization error resulting from component mismatch; and
   filter means responsive to said at least first and second digital output signals for providing the digital output signal wherein said filter means includes,
   (a) at least first and second digital integrators each including a predetermined number of accumulator cells wherein a first digital correction signal is applied to a least significant portion of said predetermined number of accumulator cells of said first digital integrator for the first logic state of said first digital output signal to substitute said first digital correction signal as a weighted value of said first digital output signal while a second digital correction signal is applied to said least significant portion of said predetermined number of accumulator cells for the second logic state of said first digital output signal which compensates for the component mismatches thereby reducing the quantization error and increasing the resolution of the digital output signal, and (b) at least first and second digital differentiators coupled between said at least first and second digital integrators and the output bus.

2. The oversampling analog-to-digital converter of claim 1 wherein said first digital integrator includes first and second inputs and an output for providing a digital output signal, said first input being coupled for receiving said first digital correction signal, said second input being coupled for receiving said first digital output signal of said first means.

3. The oversampling analog-to-digital converter of claim 2 wherein said second digital integrator includes first and second inputs and an output for providing a digital output signal, said first input being coupled for receiving said digital output signal of said first digital integrator, said second input being coupled for receiving said second digital output signal of said first means.

4. The oversampling analog-to-digital converter of claim 3 wherein said first digital differentiator is coupled to the output of said second digital integrator, said second digital differentiator being coupled between said first digital differentiator and the output bus.

5. The oversampling analog-to-digital converted of claim 4 further comprising:
 a compensation circuit responsive to said first digital output signal and to the digital output signal for providing a control signal; and
 a first counter having a control input coupled for receiving said control signal of said compensation circuit and having an output coupled to said first input of said first digital integrator for providing said first digital correction signal.

6. The oversampling analog-to-digital converter of claim 5 wherein said first digital integrator includes:
 a first plurality of accumulating cells serially coupled for providing said least significant portion of said predetermined number of accumulator cells wherein each of said first plurality of accumulating cells has an input, an output, a carry-in input and a carry-out output, said carry-out output of each being coupled to said carry-in input of the next most significant cell;
 a second plurality of accumulating cells serially coupled for providing the most significant portion of said predetermined number of accumulator cells wherein each of said first plurality of accumulating cells has an input, an output, a carry-in input and a carry-out output, said carry-out output of each being coupled to said carry-in input of the next most significant cell; and
 a multiplexer having a control input responsive to said first digital output signal for applying said first digital correction signal to said least significant portion of said predetermined number of accumulator cells for the first logic state of said first digital output signal and applying said second digital correction signal to said least significant portion of said predetermined number of accumulator cells for the second logic state of said first digital output signal.

7. The oversampling analog-to-digital converter of claim 1 wherein said first means includes:
 a first quantization loop responsive to the analog input signal for providing said first digital output signal at a first output and a first error signal proportional to the difference between the integrated value of the analog input signal and said first digital output signal at a second output; and
 a second quantization loop responsive to said first error signal for providing said second digital output signal at a first output and a second error signal proportional to the difference between the integrated value of said first error signal and said second digital output signal at a second output.

8. The oversampling analog-to-digital converter of claim 7 wherein said first quantization loop includes:
 a first summing circuit having first and second inputs and having an output, said first input being coupled for receiving the analog input signal;
 an integrating circuit having an input coupled to said output of said first summing circuit and having an output;
 a comparator having first and second inputs and having an output, said first input being coupled to said output of said integrating circuit, said second input being coupled to a terminal at which a reference potential is applied;
 a flipflop having an input coupled to said output of said comparator and having an output for providing said digital output signal;
 a digital-to-analog converter coupled between said output of said first flipflop and said second input of said first summing circuit; and
 a second summing circuit having first and second inputs and having an output for providing said first error signal, said first input being coupled to the output of said digital-to-analog converter, said second input being coupled to said output of said integrating circuit.

9. The oversampling analog-to-digital converter of claim 5 wherein said compensation circuit includes:
 a first latch having an input and an output and having a clock input, said input being coupled for receiving the digital output signal;
 a second latch having an input and an output and having a clock input, said input being coupled for receiving the digital output signal;
 an adder having first and second inputs and having an output, said first input being coupled to said output of said first latch, said second input being coupled to said output of said second latch, said output being coupled to said control input of said first counter;
 a flipflop having an input coupled for receiving said first digital output signal and having an output and a clock input for receiving a sample clock signal;
 a logic gate having first and second inputs and having an output for providing an output signal as the exclusive-NOR combination of the signals applied at said first and second inputs, said first input being coupled to said input of said flipflop, said second input being coupled to said output of said flipflop;
 a second counter having a control input for preloading said second counter with a predetermined value, a clock input for receiving said sample clock signal and having an output coupled to said clock input of said first latch; and a delay circuit coupled between said output of said second counter and said clock input of said second latch for providing a predetermined time delay for the signal propagating therethrough.

10. An oversampled analog-to-digital converter having a sampling frequency greater than the maximum frequency component of an analog input signal for providing a digital output signal with increased resolution at an output bus wherein the analog-to-digital converter includes at least first and second quantization loops, the first quantization loop being responsive to the analog input signal for providing a first digital output signal and a first error signal proportional to the difference between an integrated value of the analog input signal and the first digital output signal, the second quantization loop being responsive to the first error signal for providing the second digital output signal, wherein the improvement comprises:

a comb filter responsive to the first and second digital output signals of the first and second quantization loops for providing the digital output signal wherein said comb filter includes, (a) at least first and second digital integrators each including a predetermined number of accumulator cells wherein a first digital correction signal is applied to a least significant portion of said predetermined number of accumulator cells of said first digital integrator for the first logic state of the first digital output signal while a second digital correction signal is applied to said least significant portion of said predetermined number of accumulator cells for the second logic state of the first digital output signal to substitute said first digital correction signal as a weighted value of the first digital output signal, and (b) at least first and second digital differentiators coupled between said at least first and second digital integrators and the output bus.

11. The oversampling analog-to-digital converter of claim 10 wherein said first digital integrator includes first and second inputs and an output for providing a digital output signal, said first input being coupled for receiving said first digital correction signal, said second input being coupled for receiving the first digital output signal of said first means.

12. The oversampling analog-to-digital converter of claim 11 wherein said second digital integrator includes first and second inputs and an output for providing a digital output signal, said first input being coupled for receiving said digital output signal of said first integrator, said second input being coupled for receiving said second digital output signal of said first means.

13. The oversampling analog-to-digital converter of claim 12 wherein said first digital differentiator is coupled to the output of said second digital integrator, said second digital differentiator being coupled between said first digital differentiator and the output bus.

14. The oversampling analog-to-digital converter of claim 13 further comprising:

a compensation circuit responsive to the first digital output signal and to the digital output signal for providing a control signal; and a first counter having a control input coupled for receiving said control signal of said compensation circuit and having an output coupled to said first input of said first digital integrator for providing said first digital correction signal.

15. The oversampling analog-to-digital converter of claim 14 wherein said first digital integrator includes:

a first plurality of accumulating cells serially coupled for providing said least significant portion of said predetermined number of accumulator cells wherein each of said first plurality of accumulating cells has an input, an output, a carry-in input and a carry-out output, said carry-out output of each being coupled to said carry-in input of the next most significant cell;

a second plurality of accumulating cells serially coupled for providing the most significant portion of said predetermined number of accumulator cells wherein each of said first plurality of accumulating cells has an input, an output, a carry-in input and a carry-out output, said carry-out output of each being coupled to said carry-in input of the next most significant cell; and a multiplexer having a control input responsive to the first digital output signal for applying said first digital correction signal to said least significant portion of said predetermined number of accumulator cells for the first logic state of the first digital output signal and applying said second digital correction signal to said least significant portion of said predetermined number of accumulator cells for the second logic state of the first digital output signal.

16. The oversampling analog-to-digital converter of claim 15 wherein said compensation circuit includes:

a first latch having an input and an output and having a clock input, said input being coupled for receiving the digital output signal;

a second latch having an input and an output and having a clock input, said input being coupled for receiving the digital output signal;

an adder having first and second inputs and having an output, said first input being coupled to said output of said first latch, said second input being coupled to said output of said second latch, said output being coupled to said control input of said first counter;

a flipflop having an input coupled for receiving the first digital output signal and having an output and a clock input for receiving a sample clock signal;

a logic gate having first and second inputs and having an output for providing an output signal as the exclusive-NOR combination of the signals applied at said first and second inputs, said first input being coupled to said input of said flipflop, said second input being coupled to said output of said flipflop;

a second counter having a control input for preloading said second counter with a predetermined value, a clock input for receiving said sample clock signal and having an output coupled to said clock input of said first latch; and a delay circuit coupled between said output of said second counter and said clock input of said second latch for providing a predetermined time delay for the signal propagating therethrough.

17. An integrated oversampling analog-to-digital converter responsive to an analog input signal for providing a digital output signal representative of the magnitude of the analog input signal at an output bus, comprising:

first means for quantizing the analog input signal into at least first and second digital output signals wherein said at least first and second digital output signals include quantization error resulting from component mismatch; and filter means responsive to said at least first and second digital output signals for providing the digital output signal wherein said filter means includes, (a) at least first and second digital integrators each including a predetermined number of accumulator cells wherein a first digital correction signal is applied to a least significant portion of said predetermined number of accumulator cells of said first digital integrator for the first logic state of said first digital output signal to substitute said first digital correction signal as a weighted value of said first digital output signal while a second digital correction signal is applied to said least significant portion of said predetermined number of accumulator cells for the second logic state of said first digital output signal which compensates for the component mismatches thereby reducing the quantization error and increasing the resolution of the digital output signal, and (b) at least first and second digital differentiators coupled between said at least first and second digital integrators and the output bus.

18. A method of converting an analog input signal into a digital output signal representative of the magnitude of the analog input signal, comprising the steps of:

quantizing the analog input signal into at least first and second digital output signals wherein said at least first and second digital output signals include quantization error;

applying a first digital correction signal to the least significant portion of a predetermined number of accumulator cells of one of a plurality of digital integrators for the first logic state, said first digital output signal to substitute said first digital correction signal as a weighted value of said first digital output signal which compensates for the quantization error and increases the resolution of the digital output signal; and applying a second digital correction signal to the least significant portion of said predetermined number of accumulator cells for the second logic state of said first digital output signal.

* * * * *